(12) United States Patent
Tawada

(10) Patent No.: US 8,658,887 B2
(45) Date of Patent: Feb. 25, 2014

(54) SUBSTRATE PROVIDED WITH TRANSPARENT CONDUCTIVE FILM FOR PHOTOELECTRIC CONVERSION DEVICE, METHOD FOR MANUFACTURING THE SUBSTRATE, AND PHOTOELECTRIC CONVERSION DEVICE USING THE SUBSTRATE

(75) Inventor: Yuko Tawada, Otsu (JP)

(73) Assignee: Kaneka Corporation, Osaka-shi (JP)

( * ) Notice: Subject to any disclaimer, the term of this patent is extended or adjusted under 35 U.S.C. 154(b) by 309 days.

(21) Appl. No.: 12/446,737

(22) PCT Filed: Nov. 12, 2007

(86) PCT No.: PCT/JP2007/071902
§ 371 (c)(1),
(2), (4) Date: Apr. 22, 2009

(87) PCT Pub. No.: WO2008/062685
PCT Pub. Date: May 29, 2008

(65) Prior Publication Data
US 2010/0024862 A1    Feb. 4, 2010

(30) Foreign Application Priority Data

Nov. 20, 2006    (JP) .................................. 2006-313336

(51) Int. Cl.
*H01L 31/042*    (2006.01)
*H01L 31/10*    (2006.01)
*H01L 21/44*    (2006.01)

(52) U.S. Cl.
USPC ........... 136/256; 136/244; 438/608; 438/609; 257/734; 257/749

(58) Field of Classification Search
USPC .................. 136/244, 256; 257/734, 741, 749, 257/E21.143, E21.159; 438/608, 609
See application file for complete search history.

(56) References Cited

U.S. PATENT DOCUMENTS 5,261,968 A * 11/1993 Jordan .......................... 136/244
5,981,867 A * 11/1999 Toyama et al. ............... 136/256

(Continued)

FOREIGN PATENT DOCUMENTS

EP    1 732 139 A1    12/2006
JP    07-131044    5/1995

(Continued)

OTHER PUBLICATIONS

English Translation of JP 2005-311292 Sasaki et al from IDS.*

(Continued)

*Primary Examiner* — Jonathan Johnson
*Assistant Examiner* — Andrew Golden
(74) *Attorney, Agent, or Firm* — Alleman Hall McCoy Russell & Tuttle LLP

(57) ABSTRACT

Provided in this invention is a low-cost substrate provided with a transparent conductive film for photoelectric conversion device, which can improve performance of the photoelectric conversion device by enhanced light confinement effect achieved with effectively increased surface unevenness of the substrate. A method for manufacturing said substrate and a photoelectric conversion device using said substrate which can show improved performance are also provided. The substrate provided with the transparent conductive film for the photoelectric conversion device comprises a transparent insulating substrate and a transparent electrode layer containing at least zinc oxide deposited on the transparent insulating substrate, wherein the transparent electrode layer is composed of a double layer structure wherein first and second transparent conductive films are deposited in this order from a substrate side. The transparent conductive film has an average film thickness of 10-500 nm, and the second transparent conductive film has an average film thickness of 300-1,500 nm. The average film thickness of the second transparent conductive film is larger than that of the first transparent conductive film, and an average height difference of the unevenness on the surface of the second transparent conductive film is 10-300 nm, which is larger than that of the first transparent conductive film.

6 Claims, 3 Drawing Sheets

(56) References Cited

U.S. PATENT DOCUMENTS

| | | | | |
|---|---|---|---|---|
| 6,140,570 A | * | 10/2000 | Kariya | 136/256 |
| 6,750,394 B2 | * | 6/2004 | Yamamoto et al. | 136/256 |
| 2005/0145972 A1 | * | 7/2005 | Fukuda et al. | 257/458 |
| 2007/0169805 A1 | | 7/2007 | Sasaki et al. | 136/256 |

FOREIGN PATENT DOCUMENTS

| | | | |
|---|---|---|---|
| JP | 11-233800 | | 8/1999 |
| JP | 2000-252500 | | 9/2000 |
| JP | 2000-294812 | | 10/2000 |
| JP | 2002217428 A | * | 8/2002 |
| JP | 2004-311704 | | 11/2004 |
| JP | 2005-311292 | | 11/2005 |

OTHER PUBLICATIONS

Haga et al, "High-quality ZnO films prepared on Si wafers by low-pressure MO-CVD", 2003, Thin Solid Films 433, 131-134.*

Herrero, "Improved ITO thin films for photovoltaic applications with a thin ZNO layer by sputtering",2004, Thin Solid Films 451-452, 630-633.*

JP 2002-217428 english machine translation.*

Preliminary Search Report and Written Opinion issued on Jun. 4, 2009 for corresponding International Application No. PCT/JP2007/071902. Cited references and non-patent documents filed on Apr. 22, 2009.

Tokio Nakada et al., "Textured ZnO:Al Films for Solar Cell by DC-Magnetron Sputtering in Water Vapor Plasma", Conf. Rec IEEE Photovoltaic Spec Conf. $22^{nd}$, vol. 2 (1991) pp. 1389-1392, Fig. 7.

* cited by examiner hν

SUBSTRATE PROVIDED WITH TRANSPARENT CONDUCTIVE FILM FOR PHOTOELECTRIC CONVERSION DEVICE, METHOD FOR MANUFACTURING THE SUBSTRATE, AND PHOTOELECTRIC CONVERSION DEVICE USING THE SUBSTRATE

CROSS-REFERENCE TO THE RELATED APPLICATIONS

This application is a national stage of international application No. PCT/JP2007/071902 filed Nov. 12, 2007, which also claims the benefit of priority under 35 USC 119 to Japanese Patent Application No. 2006-313336 filed Nov. 20, 2006, the entire contents of which are incorporated herein by reference.

TECHNICAL FIELD

The present invention relates to a substrate provided with a transparent conductive film for a photoelectric conversion device, a method for manufacturing the substrate, and a photoelectric conversion device using the substrate.

BACKGROUND ART

In recent years, in order to make reduction of costs and attainment of higher efficiency be compatible with each other in a solar cell which is one of the photoelectric conversion devices, a thin film solar cell, which can be produced with a small amount of raw materials, is attracting people's attention, and the development is eagerly carried out. In particular, a method of forming a good-quality semiconductor layer on an inexpensive substrate such as glass plate by using a low-temperature process is expected as a method that can realize low costs.

Generally, a thin film solar cell includes a transparent electrode, at least one semiconductor thin film photoelectric conversion unit, and a back electrode that are sequentially superimposed on a transparent substrate. Further, one photoelectric conversion unit includes an i-type layer (which is also referred to as a photoelectric conversion layer) that is sandwiched between a p-type layer and an n-type layer which are conductivity type layers.

Meanwhile, a thin film solar cell can reduce the thickness of the photoelectric conversion layer as compared with a conventional solar cell that uses a bulk single crystal or polycrystal silicon. On the negative side thereof, however, there is a problem in that the light absorption by the total thin film may be restricted due to its small thickness. Therefore, in order to utilize the light that is incident into the photoelectric conversion unit including the photoelectric conversion layer, a devise is carried out in which the surface of the transparent conductive film or the metal layer that is in contact with the photoelectric conversion unit is made uneven (made into a texture) and, after light is scattered at the interface thereof, the light is made incident into the photoelectric conversion unit so as to extend the optical path length and to increase the amount of light absorption within the photoelectric conversion layer. This technique is referred to as "light confinement", and is an important element technique in putting a thin film solar cell having a high photoelectric conversion efficiency into practical use.

An amorphous silicon solar cell which is one example of a thin film solar cell is formed on a substrate such as glass plate and often uses a tin oxide ($SnO_2$) film having a surface unevenness as a transparent electrode layer. This surface unevenness of the transparent electrode layer effectively contributes to the light confinement into the photoelectric conversion layer. However, a glass substrate on which an $SnO_2$ film is formed by the thermal chemical vacuum deposition method (thermal CVD method) as a transparent electrode layer having a surface unevenness effective for light confinement necessitates a high-temperature process of about 550 to 650° C. for forming the transparent electrode layer thereof, thereby raising a problem of high production costs. Also, since the film forming temperature is high, there is a problem in that an inexpensive substrate such as a plastic film cannot be used. In addition, when a tempered glass is subjected to a high-temperature process, the reinforcement is removed, so that the tempered glass cannot be used as a substrate. In application to a large-area solar cell, in order to ensure the strength of the glass substrate, a thickness of the glass plate have to be increased and this raises a problem in that the whole solar cell will be heavy, as a result.

In addition, the $SnO_2$ film has a low plasma resistance, so that the $SnO_2$ film will be reduced under a photoelectric conversion layer deposition environment at a large plasma density using hydrogen. When the $SnO_2$ film is deoxidized, it will be blackened, and the blackened transparent electrode layer part absorbs incident light, whereby the amount of light transmitted into the photoelectric conversion layer will decrease, giving cause for inviting decrease in the conversion efficiency.

Furthermore, compared with a single crystal silicon or polycrystal silicon solar cell, an amorphous silicon solar cell has a problem of having a lower initial photoelectric conversion efficiency, and moreover the conversion efficiency decreases by a photodegradation phenomenon. Therefore, a crystalline silicon thin film solar cell using crystalline silicon such as a thin film polycrystal silicon or microcrystalline silicon as a photoelectric conversion layer is expected and studied as one capable of making reduction of costs and attainment of higher efficiency be compatible. This is because a crystalline silicon thin film solar cell can be formed at a low temperature by the plasma enhanced CVD method in the same manner as the forming of amorphous silicon, and further, little photodegradation phenomenon occurs. Also, while an amorphous silicon photoelectric conversion layer can perform photoelectric conversion of light having a wavelength of about 800 nm on the longer wavelength side, a crystalline silicon photoelectric conversion layer can perform photoelectric conversion of light up to having a wavelength of about 1200 nm which is longer than that. However, compared with a deposition condition for forming amorphous silicon, higher plasma density is required for depositing a crystalline silicon photoelectric conversion layer, so that when an $SnO_2$ film is used in a transparent electrode, a great improvement in the conversion efficiency has been difficult.

Here, the terms of "crystalline" and "microcrystalline" in the specification of the present application are assumed to include partially amorphous material.

On the other hand, zinc oxide (ZnO) is less expensive than $SnO_2$ or indium tin oxide (ITO) that is widely used as a material of a transparent electrode layer, and also has an advantage of having a high plasma resistance. Therefore, zinc oxide is suitable as a transparent electrode layer material for a thin film solar cell.

Precedent Example 1

A substrate for a thin film solar cell provided with a ZnO film disclosed in Patent Document 1 for example. According to Patent Document 1, a substrate for a thin film solar cell having a surface unevenness can be provided by forming an underlying layer having a small particle size on a transparent insulating substrate such as glass plate and forming a ZnO film thereon by the low-pressure CVD method (or also referred to as the MOCVD method) under a low-temperature condition of 150° C. or higher and 200° C. or lower. Cost reduction can be achieved when this low-pressure CVD method is employed, because it is a lower temperature process such as 200° C. or lower as compared with the high-pressure thermal CVD method. Also, an inexpensive substrate such as a plastic film can be used. Further, since a tempered glass can be used, the thickness of the glass substrate of a large-area solar cell can be reduced to about ⅔ thereof, thereby reducing the weight. Also, by the low-pressure CVD method, a film can be formed at a larger forming speed by one digit as compared with the sputtering method, and also the efficiency of using a raw material is high, so that it is preferable for a thin film solar cell in view of the production cost.

Precedent Example 2

On the other hand, Patent Document 2 shows the following example as a method for forming unevenness on the surface of a transparent electrode of a substrate for a thin film solar cell. The transparent electrode is made to have a double layer structure in which first and second transparent conductive films are deposited from the substrate side and, even in the case in which the surface unevenness of the first transparent conductive film is too rough, the second transparent conductive film is made to have a smooth surface unevenness. This is a technique such that, by doing so, the spike-shaped protruding parts can be eliminated, and the short circuit between the junctions in the photoelectric conversion unit can be reduced, whereby the variation in the performance of the photoelectric conversion device can be reduced.

Patent Document 1: Japanese Patent Application Laid-Open No. 2005-311292

Patent Document 2: Japanese Patent Application Laid-Open No. 2000-252500

DISCLOSURE OF THE INVENTION

Problems to be Solved by the Invention

An object of the present invention is to increase the light confinement effects by effectively increasing the surface unevenness of a substrate for a photoelectric conversion device used in a thin film solar cell or the like, thereby to provide a substrate for a photoelectric conversion device that improves the performance of a photoelectric conversion device with use of an inexpensive production method. Further, an object thereof is to improve the performance of a photoelectric conversion device by using the substrate.

First, according to the method disclosed in the Examples of Patent Document 1, in order to make a substrate for a thin film solar cell, the transparent electrode layer mainly using a ZnO film must be made to be about 1.5 to 1.6 μm, and a film thickness of about the double has been needed even when compared with an $SnO_2$ film formed by the thermal CVD method of high temperature. This seems to be caused by the fact that the grain size of the ZnO film is small because it is mainly formed at a low temperature and the mobility as a transparent conductive film is small. Also, when the film thickness of the transparent electrode layer is large, the film exfoliation from the transparent insulating substrate generated by the internal stress within the transparent electrode layer will be a problem in an integration processing step of a large area.

Further, in the Examples of Patent Document 2, the first transparent electrode film having a large surface unevenness is shown only for the case of $SnO_2$ formed by the thermal CVD method under a high temperature. Therefore, the present inventors have confirmed using a ZnO film formed by the low-pressure CVD method that, in order to obtain one having an average height difference of the surface unevenness of the first transparent conductive film of 100 to 1000 nm, a film thickness of 2 μm or more is needed, and it has been found out that a problem in the processing step will be generated in the same manner as in the case of Patent Document 1.

Means for Solving the Problems

In view of the above problems, as a result of eager studies on a method of forming a sufficient surface unevenness in a region where the film thickness of the transparent electrode layer itself is small, the present inventors have unexpectedly found out that, by forming a thin ZnO film which will be a nucleus of growth before depositing a main ZnO film, there are cases such that the surface unevenness of the transparent electrode layer made of the main ZnO film deposited thereon can be formed to be large, thereby the present invention have been completed.

In order to solve the above problems, a substrate provided with a transparent conductive film for a photoelectric conversion device of the present invention includes a transparent insulating substrate and a transparent electrode layer containing at least zinc oxide (ZnO) deposited thereon. The transparent electrode layer is composed of a double layer structure wherein first and second transparent conductive films are deposited from a substrate side. The first transparent conductive film has an average film thickness of 10 to 500 nm, and the second transparent conductive film has an average film thickness of 300 to 1500 nm. An average height difference of an unevenness on a surface of the second transparent conductive film is 10 to 300 nm, and the average height difference of the unevenness on the surface thereof is larger than that of the first transparent conductive film.

In particular, it is characterized in that the average film thickness of the second transparent conductive film is larger than the average film thickness of the first transparent conductive film.

Since, in the present invention, the substrate provided with a transparent conductive film for the photoelectric conversion device has such a construction of the transparent electrode layer as described above, the substrate having haze ratio of 20% or more can be obtained readily. Thereby, it will be able to generate the light confinement effectively, so that the performance of the photoelectric conversion device can be improved. The haze ratio is a ratio of a diffusion light transmittance to a total light transmittance as measured by using a C light source or a D65 light source, which is one index of the unevenness of the substrate.

The substrate provided with the transparent conductive film for the photoelectric conversion device of the present invention as described above can be produced by deposition using a step of forming a first transparent conductive film by the sputtering method and a step of forming a second transparent conductive film by the low-pressure CVD method, successively on a transparent insulating substrate.

Also, a photoelectric conversion device according to the present invention includes at least one crystalline photoelectric conversion unit deposited on the substrate provided with the transparent conductive film for the photoelectric conversion device, and a back electrode layer. These layers are further separated by a plurality of separation grooves so as to form a plurality of photoelectric conversion cells, and the plurality of these photoelectric conversion cells are electrically connected with each other in series via a plurality of connection grooves.

Effects of the Invention

According to the present invention, a substrate provided with a transparent conductive film for a photoelectric conversion device producing large light confinement effects can be provided by effectively increasing the unevenness of the substrate provided with a transparent electrode layer using an inexpensive production method. Also, by applying this substrate provided with a transparent conductive film for a photoelectric conversion device to a photoelectric conversion device, the performance of the photoelectric conversion device can be improved by increasing the generated electric current owing to the light confinement effects. Further, a substrate provided with a transparent conductive film for a photoelectric conversion device having a large surface unevenness can be fabricated with a thickness of the transparent conductive film of about 1 μm, whereby the process damage to the transparent electrode layer at the time of fabricating an integrated structure can be restrained, making the light confinement effects and the low resistance be compatible with each other. This is effective in improving the performance and the reliability of the photoelectric conversion device.

DESCRIPTION OF THE SYMBOLS

Figure 1:
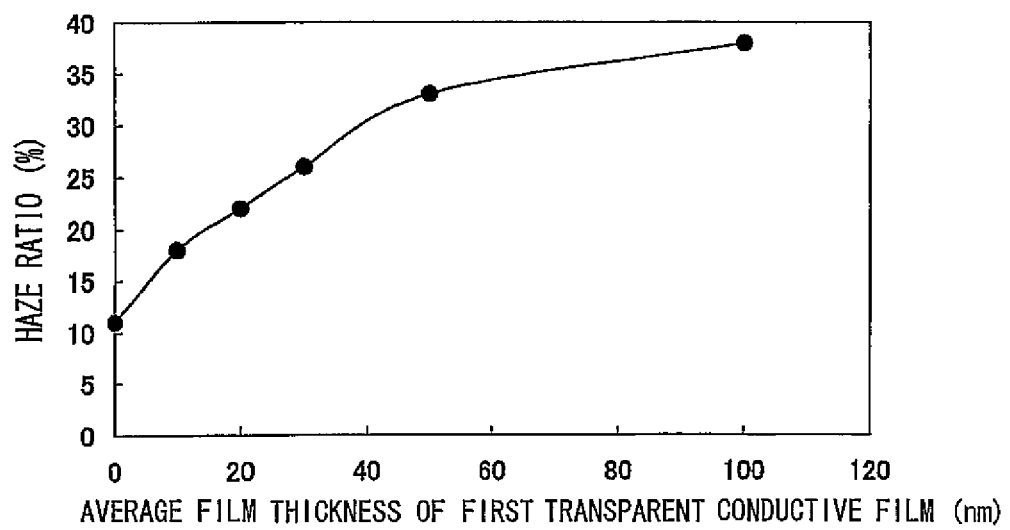
FIG. 1 is a haze ratio of a substrate provided with a transparent conductive film for a photoelectric conversion device relative to an average film thickness of a first transparent conductive film.

In the drawings, 1 represents a substrate provided with a transparent conductive film for a photoelectric conversion device, 11 a transparent insulating substrate, 12 a transparent electrode layer, 121 a first transparent conductive film, 122 a second transparent conductive film, 2 a photoelectric conversion unit, 21 one-conductivity type layer, 22 an intrinsic photoelectric conversion layer, 23 an opposite-conductivity type layer, 3 a back electrode layer, 31 a conductive oxide layer, 32 a metal layer, 4 a photoelectric conversion device, 6 an integrated-type photoelectric conversion device, 61 a photoelectric conversion device cell, 62 a transparent electrode layer separation groove, 63 a connection groove, and 64 a back electrode layer separation groove.

BEST MODE FOR CARRYING OUT THE INVENTION

The present inventors have made eager studies on the fabrication of a substrate provided with a transparent conductive film for a photoelectric conversion device mainly concentrating on a transparent electrode layer by the low-pressure CVD method. As a result thereof, the present inventors have found out that, with the transparent electrode layer using the low-pressure CVD method, the size of the unevenness of the substrate provided with a transparent conductive film for a photoelectric conversion device will differ depending on the presence or absence of the first transparent conductive film and, in particular, that the film thickness dependency of the unevenness of the substrate provided with a transparent conductive film for a photoelectric conversion device will differ depending on the presence or absence of the first transparent conductive film.

Here, in the present invention, the haze ratio is mainly used as an evaluation index of the unevenness of a substrate provided with a transparent conductive film for a photoelectric conversion device. The haze ratio is represented by (diffusion light transmittance/total light transmittance)×100 [%] (JIS K7136). With regard to the measurement of the haze ratio, a haze meter is commercially available which makes automatic measurement of the haze ratio, whereby the measurement can be carried out easily. As a light source for the measurement, a C light source or a D65 light source are generally used.

Also, as a method for evaluating the average film thickness of the first transparent conductive film and the average film thickness of the second transparent conductive film in the present invention, it is possible to carry out by a method of using a probe step difference meter or an ellipsometry every time after each film is formed or by an electron microscope (TEM, SEM, STEM, or the like) observation. Here, when the measurement is carried out by TEM observation, it is possible to distinguish between the transparent conductive film formed by the sputtering method and the transparent conductive film formed by the low-pressure CVD method. Therefore, the evaluation of the average film thickness of the transparent conductive film in the present invention is most preferably carried out by the TEM observation.

FIG. 1 shows the haze ratio of a substrate provided with a transparent conductive film for a photoelectric conversion device relative to the average film thickness of the first transparent conductive film in the first embodiment of the present invention. In the first embodiment, the first transparent conductive film is formed by the sputtering method and the second transparent conductive film is formed by the low-pressure CVD method in a structure such that the first transparent conductive film and the second transparent conductive film mainly made of zinc oxide (ZnO) are superimposed as a transparent electrode layer. Glass was used as a substrate, and ZnO containing Al as a dopant was used as the first transparent conductive film. The second transparent conductive film was formed with ZnO by the low-pressure CVD method using a mixture gas of diethyl zinc (DEZ), water, diborane ($B_2H_6$), hydrogen, and argon as a source gas. The film thickness of the second transparent conductive film of FIG. 1 is about 1.1 μm, and is constant. Also, the haze ratio of a glass substrate on which only the first transparent conductive film had been formed was 1.0% or less, and there was little optical scattering effect.

As will be understood from FIG. 1, when the first transparent conductive film is absent, the haze ratio is about 10% when the average film thickness of the second transparent conductive film is about 1.1 μm. When the first transparent conductive film was absent, in order to obtain a haze ratio of 20% or more, an average film thickness of about 1.5 to 2 μm was needed. In contrast, when the first transparent conductive film is present, a haze ratio of 20% or more can be obtained even when the average film thickness of the second transparent conductive film is about 1.1 μm, though it depends on the film thickness of the first transparent conductive film. From this, it can be said that, regarding ZnO by the low-pressure CVD method, the situation of film growth differs depending on the presence or absence of the first transparent conductive film. It is conjectured that, when the average film thickness of the first transparent conductive film is 30 nm or more, the growth of the ZnO film is promoted more on the surface of the first transparent conductive film, thereby increasing the haze ratio.

Accordingly, it has been found out that, even when the film thickness of the second transparent conductive film is kept constant, the haze ratio can be greatly increased. Also, even when the film thickness of ZnO is comparatively small to be 1.0 μm, a high haze ratio of 20% or more can be obtained which is not obtainable in the case where the first transparent conductive film is absent. In this manner, a transparent conductive film having a large unevenness of a substrate for a photoelectric conversion device can be fabricated with a thickness of about 1 μm; the internal stress generated within the transparent conductive film can be reduced; and the process damage to the transparent electrode layer at the time of fabricating an integrated structure can be restrained, making the light confinement effects and the low resistance be compatible with each other. This is effective in improving the performance and the reliability of the photoelectric conversion device.

Figure 2:
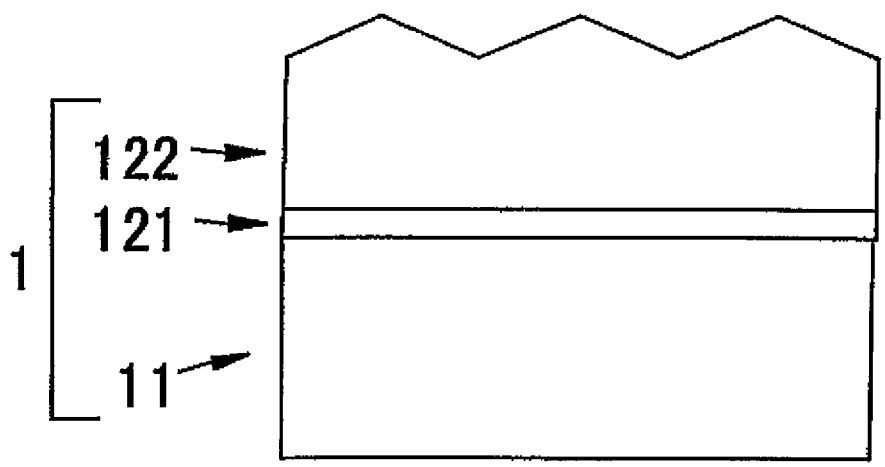
FIG. 2 is a cross-sectional view of a substrate provided with a transparent conductive film for a photoelectric conversion device, which is one embodiment of the present invention.

FIG. 2 is a schematic cross-sectional view of a substrate 1 provided with a transparent conductive film for a photoelectric conversion device of the present invention. The substrate 1 provided with the transparent conductive film for the photoelectric conversion device of the present invention is formed by depositing a transparent electrode layer 12 on a transparent insulating substrate 11.

Here, since the transparent insulating substrate 11 is positioned on the light incidence side when the photoelectric conversion device is constructed, so that the transparent insulating substrate 11 is preferably as transparent as possible in order to allow more solar light to be transmitted and to be absorbed into an amorphous or crystalline photoelectric conversion unit. As a material thereof, a glass plate, a transparent plastic film, or the like is used. Under a similar intention, it is preferable to carry out non-reflection coating on the light incidence surface of the transparent insulating substrate 11 in order to reduce the light reflection loss at the light incidence surface of the solar light.

Regarding the transparent electrode side of the transparent insulating substrate 11, a fine surface unevenness may be imparted to the surface of the transparent insulating substrate 11 in order to improve the adhesion force of the transparent electrode layer 12.

The transparent electrode layer 12 is constructed to have a double-layer structure in which first and second transparent conductive films are deposited. The first transparent conductive film 121 plays a role of controlling the growth of the second transparent conductive film 122 that will be deposited next. When the second transparent conductive film 122 grows, the nucleus generation of the second transparent conductive film 122 occurs effectively on the surface of the first transparent conductive film 121. For this reason, it seems that, even when the thickness of the second transparent conductive film 122 is comparatively small, a large surface unevenness can be formed, thereby improving the haze ratio. Therefore, it is preferable that the major components of the first and second transparent conductive films are the same, and are preferably made mainly of ZnO. When the thickness of the first transparent conductive film 121 is too small, it does not contribute to the nucleus generation control of the second transparent conductive film 122, whereas when the thickness of the first transparent conductive film 121 is too large, the film-forming costs thereof will increase due to increase in the film-forming time. Therefore, the average film thickness of the first transparent conductive film 121 is preferably 10 to 500 nm, more preferably 10 to 300 nm.

For the first transparent conductive film 121, the sputtering method, the vacuum deposition method, or the low-pressure CVD method, which is more convenient than the high-pressure thermal CVD method that requires large equipment can be used. In particular, the first transparent conductive film 121 is preferably formed by the sputtering method. This is because, by forming it using the sputtering method, the first transparent conductive film 121 can be formed to be dense, whereby the adhesion force of the first transparent conductive film 121 onto the transparent insulating substrate 11 can be improved.

The second transparent conductive film 122 plays a role of controlling the light confinement of the substrate 1 provided with the transparent conductive film for the photoelectric conversion device. For this reason, the average height difference of the surface unevenness of the second transparent conductive film 122 is preferably 10 to 300 nm. When the surface unevenness of the second transparent conductive film 122 is too small, sufficient light confinement effects cannot be obtained, whereas when it is too large, it will be a cause of generating an electric and mechanical short circuit in the photoelectric conversion device using the substrate 1 provided with the transparent conductive film for the photoelectric conversion device, thereby provoking decrease in the characteristics of the photoelectric conversion device. Also, since the second transparent conductive film 122 plays a role of controlling the light confinement of the substrate 1 provided with the transparent conductive film for the photoelectric conversion device, the average height difference of the surface unevenness thereof is preferably larger than that of the first transparent conductive film.

As a material for the second transparent conductive film 122, it is preferable to use a transparent conductive oxide film at least containing ZnO formed by the low-pressure CVD method. This is because ZnO can form a texture having light confinement effects even at a low temperature of 200° C. or less, and also is a material having a high plasma resistance, so that it is suitable for a photoelectric conversion device having a crystalline photoelectric conversion unit. For example, the second transparent conductive film 122 made of ZnO of the substrate 1 provided with the transparent conductive film for the photoelectric conversion device of the present invention is formed at a substrate temperature of 150° C. or higher under a pressure of 5 to 1000 Pa, and using diethyl zinc (DEZ), water, doping gas, and a diluting gas as a source gas. Besides this, as a source gas of zinc, dimethyl zinc can be used. As a source gas of oxygen, oxygen, carbon dioxide, carbon monoxide, dinitrogen oxide, nitrogen dioxide, sulfur dioxide, dinitrogen pentoxide, alcohols (R(OH)), ketones (R(CO)R'), ethers (ROR'), aldehydes (R(COH)), amides ((RCO)$_x$(NH$_{3-x}$), x=1, 2, 3), or sulfoxides (R(SO)R') (here, R and R' are alkyl groups) can also be used. As the diluting gas, a rare gas (He, Ar, Xe, Kr and Rn), nitrogen, hydrogen, or the like can be used. As the doping gas, diborane ($B_2H_6$), trimethyl boron, alkyl aluminum, alkyl gallium, or the like can be used. The flow rate ratio of DEZ and water is preferably 1:1 to 1:5, and the flow rate ratio of $B_2H_6$ to DEZ is preferably 0.05% or more. Since DEZ and water are liquid at an ordinary temperature under an ordinary pressure, they are supplied after being gasified by a method such as the heated evaporation, bubbling, or spraying. When the film thickness of ZnO is made to be 0.5 to 3 μm, a thin film having a grain size of approximately 50 to 500 nm and a surface unevenness with the height of the unevenness being approximately 20 to 200 nm can be obtained, so that it is preferable in view of obtaining the light confinement effects of the photoelectric conversion device. Here, the substrate temperature as referred to herein refers to the temperature of the surface at which the substrate is in contact with the heating part of the film forming apparatus.

In the event that the second transparent conductive film 122 is constructed with a thin film mainly made of ZnO, the average film thickness of the ZnO film is preferably 300 to 1500 nm, more preferably 500 to 1200 nm. This is because, when the ZnO film is too thin, sufficient impartation itself of the unevenness that effectively contributes to the light confinement effects will be difficult, and it will be difficult to obtain electric conductivity that is needed as a transparent electrode, whereas when it is too thick, the amount of light that is transmitted through ZnO to reach the photoelectric conversion unit will decrease due to light absorption by the ZnO film itself, thereby leading to decrease in the efficiency. Further, when it is too thick, the film production cost will increase due to the increase in the film production time.

The transparent electrode layer 12 of the present invention is preferably constructed in such a manner that the average film thickness of the second transparent conductive film 122 is larger than the average film thickness of the first transparent conductive film 121 because each of the first and second transparent conductive films plays a role. By having such a construction of the transparent electrode, it will be easy for the substrate 1 provided with the transparent conductive film for the photoelectric conversion device of the present invention to make the haze ratio be 20% or more and it will be able to generate the light confinement effectively, so that the performance of the photoelectric conversion device can be improved. The haze ratio is a ratio of a diffusion light transmittance to a total light transmittance as measured by using a C light source or a D65 light source, which is one index of the unevenness of the substrate.

Figure 3:
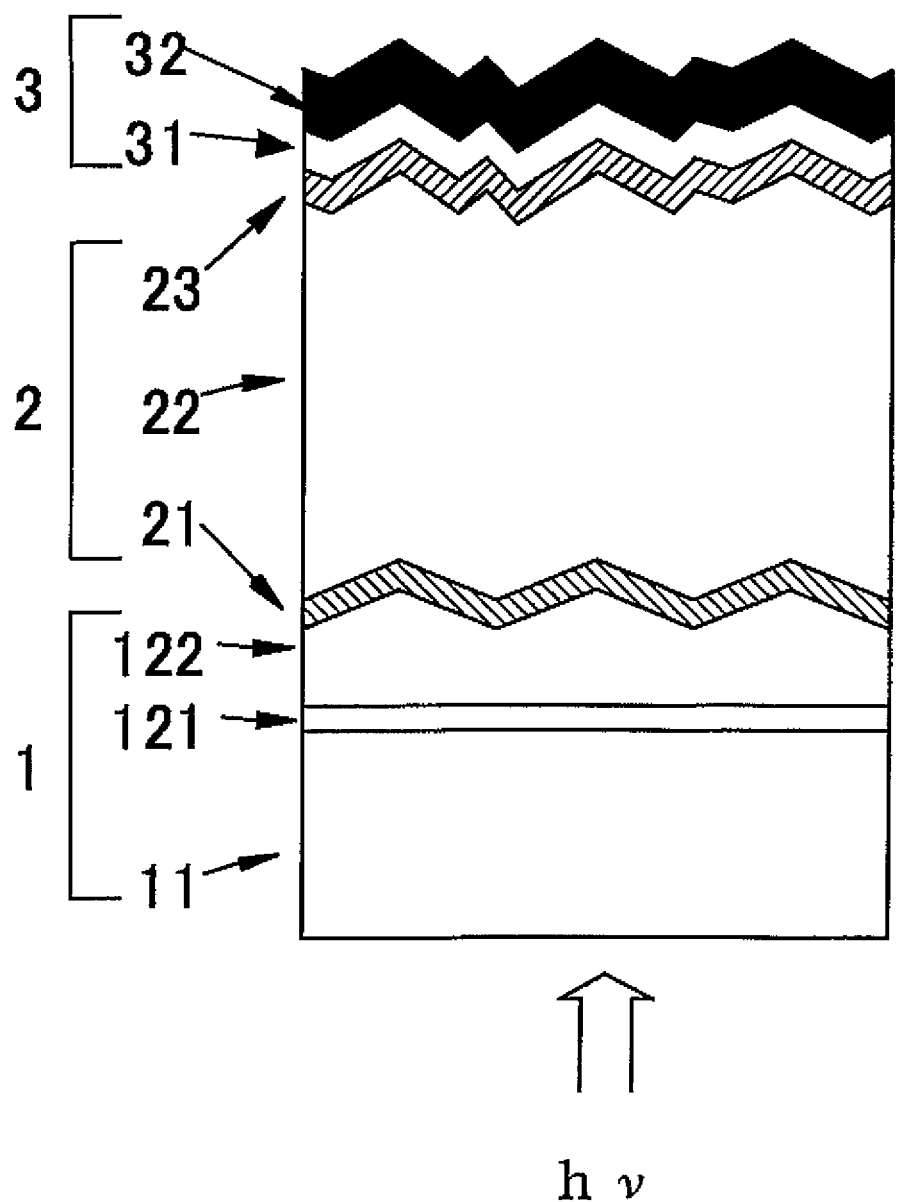
FIG. 3 is a cross-sectional view of a photoelectric conversion device, which is one embodiment of the present invention.

In FIG. 3, a photoelectric conversion device 4 according to an embodiment of the present invention is shown in a schematic cross-sectional view. This photoelectric conversion device 4 includes a first transparent conductive film 121, a second transparent conductive film 122, a crystalline photoelectric conversion unit 2, and a back electrode layer 3 that are successively deposited on a transparent insulating substrate 11. Then, the crystalline photoelectric conversion unit 2 includes a one-conductivity type layer 21, a crystalline photoelectric conversion layer 22 of substantially intrinsic semiconductor, and an opposite-conductivity type layer 23 that are sequentially deposited. To this photoelectric conversion device 4, the solar light (hv) to be subjected to photoelectric conversion is made to be incident from the transparent insulating substrate 11 side. The photoelectric conversion unit 2 may be made as one photoelectric conversion unit as illustrated; however, a plurality of photoelectric conversion units may be superimposed. As the crystalline photoelectric conversion unit 2, those having an absorption at the principal wavelength range (400 to 1200 nm) of solar light are preferable. For example, a crystalline silicon based photoelectric conversion unit can be raised in which a crystalline silicon based thin film is made to be the intrinsic crystalline semiconductor layer 22. Also, in addition to silicon, the material of "silicon based" includes a silicon alloy semiconductor material containing silicon such as silicon carbide or silicon germanium.

The crystalline silicon based photoelectric conversion unit is formed, for example, by superimposing each semiconductor layer in the order of pin type by the plasma enhanced CVD method. Specifically, for example, a p-type microcrystalline silicon based layer doped with boron which is a conductivity type determining impurity atom at 0.01 atom % or higher, an intrinsic crystalline silicon layer which will be a photoelectric conversion layer, and an n-type microcrystalline silicon based layer doped with phosphorus which is a conductivity type determining impurity atom at 0.01 atom % or higher may be deposited in this order. However, each of these layers is not limited to the above, so that, for example, an amorphous silicon based film can be used as the p-type layer. Also, as the p-type layer, an alloy material such as amorphous or microcrystalline silicon carbide or silicon germanium may be used. Here, the film thickness of the conductivity type (p-type, n-type) microcrystalline silicon based layer is preferably 3 nm or more and 100 nm or less, more preferably 5 nm or more and 50 nm or less.

The intrinsic crystalline silicon layer which is the intrinsic crystalline photoelectric conversion layer 22 is preferably formed at a substrate temperature of 300° C. or less by the plasma enhanced CVD method. By forming it at a low temperature, it is preferable to allow a lot of hydrogen atoms, which allow the defects at the crystal grain boundary or in the grains to be terminated and inactivated, to be contained. Specifically, the hydrogen content of the photoelectric conversion layer is preferably within a range of 1 to 30 atom %. This layer is preferably formed as a thin film which is a substantially intrinsic semiconductor and has a density of the conductivity type determining impurity atom of $1 \times 10^{18}$ $cm^{-3}$ or less. Further, many of the crystal grains contained in the intrinsic crystalline silicon layer preferably grow to extend in a columnar shape from the transparent electrode layer 12 side, and have a preferential crystal orientation surface of (110) relative to the film surface. The film thickness of the intrinsic crystalline silicon layer is preferably 1 μm or more in view of light absorption, and is preferably 10 μm or less in view of restraining the exfoliation due to the internal stress of the crystalline thin film. However, as the thin film crystalline photoelectric conversion unit, those having absorption at the principal wavelength region (400 to 1200 nm) of solar light are preferable, so that one may form a crystalline silicon carbide layer (for example, a crystalline silicon carbide layer made of crystalline silicon containing carbon of 10 atom % or less) or a crystalline silicon germanium layer (for example, a crystalline silicon germanium layer made of crystalline silicon containing germanium of 30 atom % or less), which are alloy materials, in place of the intrinsic crystalline silicon layer.

The back electrode layer 3 is formed on the photoelectric conversion unit 2. As the back electrode layer, it is preferable to form at least one layer of a metal layer 32 made of at least one material selected from Al, Ag, Au, Cu, Pt, and Cr by the sputtering method or the vacuum deposition method. Also, it is preferable to form a conductive oxide layer 31 such as ITO, $SnO_2$, or ZnO between the photoelectric conversion unit 2 and the metal layer 32. This conductive oxide layer 31 has a function of enhancing the light reflectivity of the back electrode layer 3 as well as enhancing the close adhesiveness between the photoelectric conversion unit 2 and the metal layer 32, and further has a function of preventing chemical change of the photoelectric conversion unit 2.

Although not illustrated in the drawings, as one embodiment of the present invention, there is a tandem type photoelectric conversion device in which an amorphous photoelectric conversion unit and a crystalline photoelectric conversion unit are sequentially superimposed on a substrate 1 provided with a transparent conductive film for a photoelectric conversion device. The amorphous photoelectric conversion unit includes a front one-conductivity type layer, an intrinsic amorphous photoelectric conversion layer, and an opposite-conductivity type layer. When an amorphous silicon based material is selected as the amorphous photoelectric conversion unit, it will have a sensitivity to the light of about 360 to 800 nm. When a crystalline silicon based material is selected as the crystalline photoelectric conversion unit, it will have a sensitivity to the light of up to about 1200 nm which is longer than that of amorphous silicon based. Therefore, a solar cell in which the amorphous silicon based photoelectric conversion unit and the crystalline silicon based photoelectric conversion unit are arranged in this order from the light incidence side will be a photoelectric conversion unit that can effectively use the incident light in a wider wavelength range. The crystalline photoelectric conversion unit may be formed in the same manner as in the third embodiment.

The amorphous photoelectric conversion unit is formed, for example, by superimposing each semiconductor layer in the order of pin type by the plasma enhanced CVD method. Specifically, for example, a p-type amorphous silicon based layer doped with boron which is a conductivity type determining impurity atom at 0.01 atom % or higher, an intrinsic amorphous silicon based layer which will be a photoelectric conversion layer, and an n-type amorphous silicon based layer doped with phosphorus which is a conductivity type determining impurity atom at 0.01 atom % or higher may be deposited in this order. However, each of these layers is not limited to the above, so that, for example, a microcrystalline silicon based film can be used as the p-type layer. Also, as the p-type layer, an alloy material such as amorphous or microcrystalline silicon carbide, silicon nitride, silicon oxide, or silicon germanium may be used. As the intrinsic amorphous photoelectric conversion layer, an alloy material such as silicon carbide or silicon germanium may be used. As the intrinsic amorphous silicon based layer, hydrogen is preferably contained at 2 to 15% within the film in order to reduce the recombination current loss of the thin film solar cell by reducing the defect density within the film. Also, the intrinsic amorphous silicon based layer is preferably such that the film thickness is 50 nm or more and 500 nm or less in order to reduce the degradation by light radiation. As the n-type layer, a microcrystalline silicon based film may be used. Here, the film thickness of the conductivity type (p-type, n-type) microcrystalline silicon based layer or amorphous silicon based layer is preferably 3 nm or more and 100 nm or less, more preferably 5 nm or more and 50 nm or less.

Also, a photoelectric conversion device according to the present invention may include at least one crystalline photoelectric conversion unit deposited on a substrate 1 provided with a transparent conductive film for a photoelectric conversion device, and a back electrode layer, and may have an integrated structure such that these layers are further separated by a plurality of separation grooves so as to form a plurality of photoelectric conversion cells, and the plurality of these photoelectric conversion cells are electrically connected with each other in series via a plurality of connection grooves.

Figure 4:
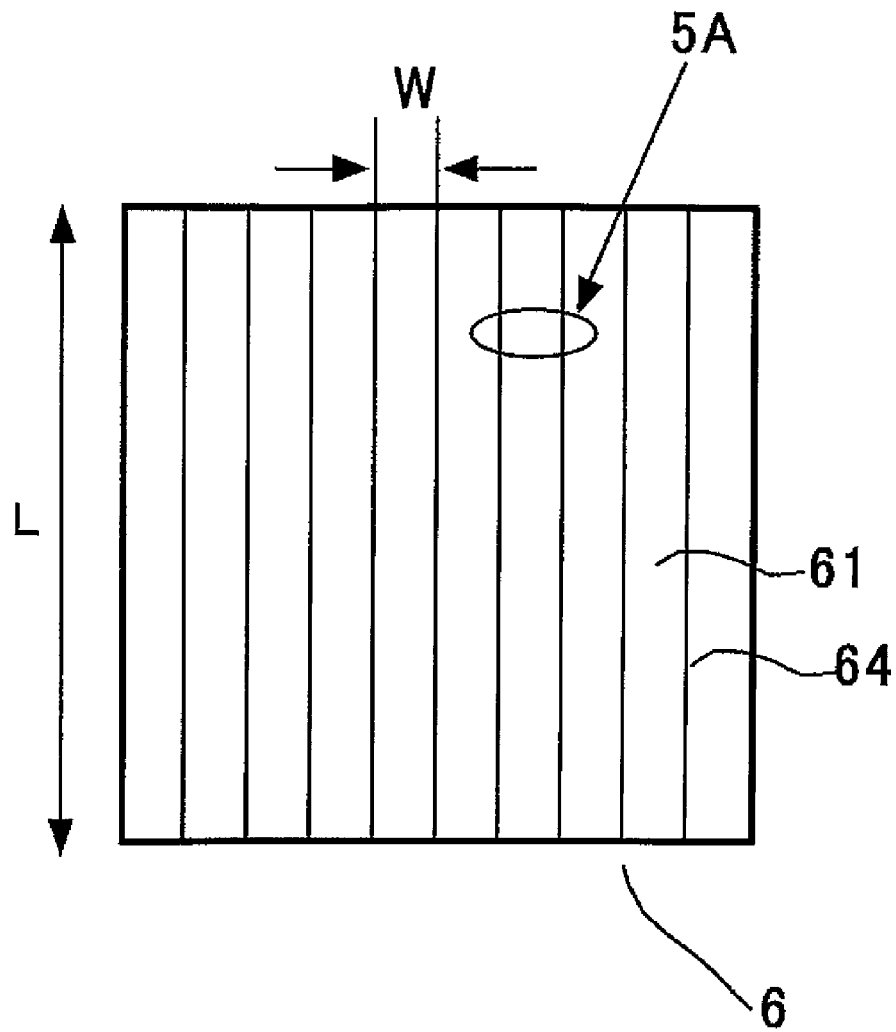
FIG. 4 is a schematic plan view showing an element surface of one typical example of an integrated-type photoelectric conversion device.
Figure 5:
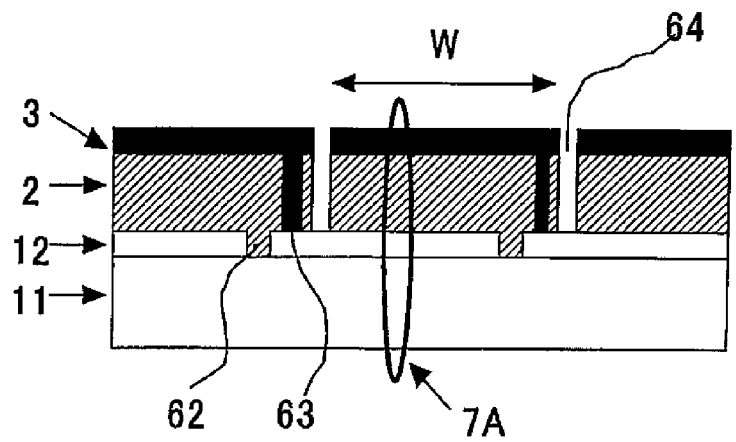
FIG. 5 is a schematic cross-sectional view showing, in a further enlargement, a more detailed integration structure of a region surrounded by an ellipse 5A within FIG. 4.

As one example of an integrated structure of a photoelectric conversion device, FIG. 4 shows a conceptual plan view. FIG. 5 is a structural cross-sectional view of a region surrounded by an ellipse 5A in FIG. 4. Also, FIG. 3 corresponds to a more detailed multilayered structural cross-sectional view of a region surrounded by an ellipse 7A in FIG. 5.

In the production of an integrated type photoelectric conversion device 6 such as shown in FIGS. 3 to 5, a glass substrate is generally used as a transparent insulating substrate 11. A transparent electrode layer 12 formed on the glass substrate is separated into strip-shaped transparent electrodes having a width W of about 10 mm by forming transparent electrode separation grooves 62 having a width of about 100 μm by laser scribing. The residues after the scribing may be removed by supersonic cleaning using water or an organic solvent. Here, as the cleaning method, a method of removing the residues by using a sticky agent or a sprayed gas can also be used.

Further, after one or more amorphous units or crystalline photoelectric conversion units are formed, these units are separated into a plurality of strip-shaped regions within a plane by connection grooves 63. Here, these connection grooves 63 are used for electrically connecting the transparent electrode layer 12 and the back electrode layer 3 between adjacent cells, so that there will be no problem even if the residues of the scribing remain partially, and the supersonic cleaning may be omitted. Subsequently, when the back electrode layer 3 is formed, the back electrode layer 3 is electrically connected to the transparent electrode layer 12 that is formed into strips as described above, via the connection grooves 63.

The back electrode layer 3 is patterned by laser scribing similar to that of the one or more amorphous units or crystalline photoelectric conversion units and, after a plurality of back electrode separation grooves 64 are formed by locally blowing the back electrode layer 3 away together with the one or more amorphous units or crystalline photoelectric conversion units, they are subjected to supersonic cleaning. This forms a plurality of strip-shaped photoelectric conversion device cells 61, and these cells are electrically connected with each other in series via the connection grooves 64. Finally, in the case of a thin film solar cell, the back surface side is protected by attachment of a sealing resin (not illustrated).

EXAMPLES

Hereafter, the present invention will be described in detail based on Examples; however, the present invention is not limited to the following description examples as long as it does not go beyond the gist thereof.

Example 1

As Example 1, a substrate 1 provided with a transparent conductive film for a photoelectric conversion device such as shown in FIG. 2 was fabricated.

As the transparent insulating substrate 11, a glass plate having a thickness of 0.7 mm with 125 mm square was used, and Al-doped ZnO was formed to a thickness of 10 nm thereon as the first transparent conductive film 121 by the sputtering method. In forming the first transparent conductive film 121, the substrate temperature was set to be 250° C.; a 3%-Al-doped ZnO with 10-inch (diameter of 254 mm) φ was used as a target; and a condition of the RF power of 400 W under an Ar gas atmosphere was used. The haze ratio as measured by the haze meter with use of a D65 light source on the obtained substrate provided with the first transparent conductive film made of the ZnO film was 0.2%. Subsequently, as the second transparent conductive film 122, B-doped ZnO was formed to a thickness of 1.1 μm by the low-pressure CVD method. This second transparent conductive film 122 was formed by the CVD method under a reduced pressure condition with a substrate temperature of 160° C. and supplying diethyl zinc (DEZ) and water as source gases, and diborane gas as a dopant gas. The obtained substrate 1 provided with the transparent conductive film for the photoelectric conversion device had a sheet resistance of about 13Ω/□ and a haze ratio of 18%. Also, the total light transmittance of the obtained substrate 1 provided with the transparent conductive film for the photoelectric conversion device was measured by allowing light to be incident from the glass plate side with use of a spectrophotometer. It showed a light transmittance of 80% or more within a wavelength range of 400 to 1200 nm.

In the obtained substrate 1 provided with the transparent conductive film for the photoelectric conversion device, the average height difference of the unevenness on the surface of the second transparent conductive film 122 was 78 nm. At this time, the average height difference of the unevenness on the surface was 7 nm in a state in which up to the first transparent conductive film 121 was formed, so that the average height difference of the unevenness on the surface of the second transparent conductive film 122 was larger. Here, as the average height difference of the unevenness on the surface in the present invention, a value obtained by doubling the arithmetic average roughness (Ra) obtained by measuring with an atomic force microscope (AFM) was used.

Example 2

In Example 2, a substrate 1 provided with a transparent conductive film for a photoelectric conversion device was fabricated in the same manner as in Example 1. However, the difference from Example 1 lies in that the thickness of the first transparent conductive film 121 was set to be 20 nm. The substrate 1 provided with the transparent conductive film for the photoelectric conversion device obtained under this condition had a sheet resistance of about 12Ω/□ and a haze ratio of 22%. Also, the total light transmittance of the obtained substrate 1 provided with the transparent conductive film for the photoelectric conversion device was measured by allowing light to be incident from the glass plate side with use of a spectrophotometer. It showed a light transmittance of 80% or more within a wavelength range of 400 to 1200 nm.

Example 3

In Example 3, a substrate 1 provided with a transparent conductive film for a photoelectric conversion device was fabricated in the same manner as in Example 1. However, the difference from Example 1 lies in that the thickness of the first transparent conductive film 121 was set to be 30 nm. The substrate 1 provided with the transparent conductive film for the photoelectric conversion device obtained under this condition had a sheet resistance of about 10Ω/□ and a haze ratio of 26%. Also, the total light transmittance of the obtained substrate 1 provided with the transparent conductive film for the photoelectric conversion device was measured by allowing light to be incident from the glass plate side with use of a spectrophotometer. It showed a light transmittance of 80% or more within a wavelength range of 400 to 1200 nm.

Example 4

In Example 4, a substrate 1 provided with a transparent conductive film for a photoelectric conversion device was fabricated in the same manner as in Example 1. However, the difference from Example 1 lies in that the thickness of the first transparent conductive film 121 was set to be 50 nm. The substrate 1 provided with the transparent conductive film for the photoelectric conversion device obtained under this condition had a sheet resistance of about 8Ω/□ and a haze ratio of 33%. Also, the total light transmittance of the obtained substrate 1 provided with the transparent conductive film for the photoelectric conversion device was measured by allowing light to be incident from the glass plate side with use of a spectrophotometer. It showed a light transmittance of 80% or more within a wavelength range of 400 to 1200 nm.

Example 5

In Example 5, a substrate 1 provided with a transparent conductive film for a photoelectric conversion device was fabricated in the same manner as in Example 1. However, the difference from Example 1 lies in that the thickness of the first transparent conductive film 121 was set to be 100 nm. The substrate 1 provided with the transparent conductive film for the photoelectric conversion device obtained under this condition had a sheet resistance of about 5Ω/□ and a haze ratio of 38%. Also, the total light transmittance of the obtained substrate 1 provided with the transparent conductive film for the photoelectric conversion device was measured by allowing light to be incident from the glass plate side with use of a spectrophotometer. It showed a light transmittance of 80% or more within a wavelength range of 400 to 1200 nm.

Comparative Example 1

In Comparative Example 1, a substrate 1 provided with a transparent conductive film for a photoelectric conversion device was fabricated approximately in the same manner as in Example 1. However, the difference from Example 1 lies in that the first transparent conductive film 121 was not formed, and the second transparent conductive film 122 made of ZnO was formed directly on the transparent insulating substrate 11. The substrate 1 provided with the transparent conductive film for the photoelectric conversion device obtained under this condition had a sheet resistance of about 18Ω/□ and a haze ratio of 11%. Also, the total light transmittance of the obtained substrate 1 provided with the transparent conductive film for the photoelectric conversion device was measured by allowing light to be incident from the glass plate side with use of a spectrophotometer. It showed a light transmittance of 80% or more within a wavelength range of 400 to 1200 nm.

FIG. 1 is a graph of the haze ratio of the substrate 1 provided with the transparent conductive film for the photoelectric conversion device according to Examples 1 to 5 as described above and Comparative Example 1 and the average thickness of the first transparent conductive film 121. From this result, it has been found out that, by forming the first transparent conductive film 121, the haze ratio of the substrate 1 provided with the transparent conductive film for the photoelectric conversion device will be improved and, by a combination of the thickness of the first transparent conductive film 121 and the thickness of the second transparent conductive film 122, the characteristics of the haze ratio of 20% or more that can expect effective light confinement effects into the photoelectric conversion device can be realized with a comparatively small film thickness of 1.1 μm of the second transparent conductive film 122.

Example 6

As Example 6, an integrated type photoelectric conversion device 6 such as shown in FIGS. 3 and 4 were fabricated.

The transparent electrode layer 12 obtained in Example 2 is separated into strip-shaped transparent electrodes having a width W of about 10 mm and a length L of about 10 cm by forming transparent electrode layer separation grooves 62 having a width of about 100 μm by laser scribing. The residues after the scribing were removed by supersonic cleaning using water.

On this transparent electrode layer 12, a crystalline photoelectric conversion layer unit 2 made of one-conductivity type layer 21 of p-type microcrystalline silicon having a thickness of 15 nm, an intrinsic crystalline photoelectric conversion layer 22 of intrinsic crystalline silicon having a thickness of 1.5 μm, and an opposite-conductivity type layer 23 of n-type microcrystalline silicon having a thickness of 15 nm was formed successively as a photoelectric conversion layer by the plasma enhanced CVD method. Thereafter, a conductive oxide layer 31 of Al-doped ZnO having a thickness of 90 nm and a metal layer 32 of Ag having a thickness of 300 nm were successively formed as the back electrode layer 3 by the sputtering method.

Light of AM1.5 was radiated at a luminous energy of 100 mw/cm$^2$ onto the silicon based integrated type photoelectric conversion device obtained as described above, and the output characteristics were measured with a result that the open circuit voltage (Voc) per one step gave 0.520V, the short-circuit current density (Jsc) was 27.6 mA/cm$^2$, a fill factor (F.F.) was 0.720, and a conversion efficiency was 10.3%.

Comparative Example 2

In Comparative Example 2, an integrated type photoelectric conversion device 6 was fabricated approximately in the same manner as in Example 6. However, the difference from Example 6 lies in that the one fabricated in Comparative Example 1 was used as a substrate 1 provided with a transparent conductive film for a photoelectric conversion device. Light of AM1.5 was radiated at a luminous energy of 100 mW/cm$^2$ onto the silicon based integrated type photoelectric conversion device obtained under this condition, and the output characteristics were measured with a result that the open circuit voltage (Voc) per one step gave 0.500V, the short-circuit current density (Jsc) was 23.1 mA/cm$^2$, a fill factor (F.F.) was 0.698, and a conversion efficiency was 8.1%.

Comparative Example 3

In Comparative Example 3, an integrated type photoelectric conversion device 6 was fabricated approximately in the same manner as in Example 6. However, the difference from Example 6 lies in that the one which was fabricated with the same construction as in Comparative Example 1 and in which B-doped ZnO was formed to a thickness of 1.6 μm was formed as the second transparent conductive film 122 by the low-pressure CVD method, was used as a substrate 1 provided with a transparent conductive film for a photoelectric conversion device. The substrate 1 provided with the transparent conductive film for the photoelectric conversion device obtained under this condition had a sheet resistance of about 10Ω/□ and a haze ratio of 23%. Also, the total light transmittance of the obtained substrate 1 provided with the transparent conductive film for the photoelectric conversion device was measured by allowing light to be incident from the glass plate side with use of a spectrophotometer. It showed a light transmittance of 80% or more in a wavelength range of 400 to 1200 nm; however, the light transmittance was low in the whole wavelength region as compared with the substrate provided with the transparent conductive film for the photoelectric conversion device used in Example 6. Light of AM1.5 was radiated at a luminous energy of 100 mW/cm$^2$ onto the silicon based integrated type photoelectric conversion device obtained using this substrate provided with the transparent conductive film for the photoelectric conversion device, and the output characteristics were measured with a result that the open circuit voltage (Voc) per one step gave 0.511V, the short-circuit current density (Jsc) was 25.7 mA/cm$^2$, a fill factor (F.F.) was 0.721, and a conversion efficiency was 9.5%.

From the result of Example 6 and Comparative Example 2, it has been found out that the haze ratio of the substrate 1 provided with the transparent conductive film for the photoelectric conversion device that has been improved by forming the first transparent conductive film 121 produces effective light confinement effects into the photoelectric conversion device. Also, from the result of Example 6 and Comparative Example 2, it has been found out, even with the substrate 1 provided with the transparent conductive film for the photoelectric conversion device having a similar haze ratio, the substrate 1 provided with the transparent conductive film for the photoelectric conversion device that can reduce the thickness of the second transparent conductive film 122 by inserting the first transparent conductive film 121 produces effective light confinement effects into the photoelectric conversion device. This can be conjectured to be caused by the fact that the first transparent conductive film 121 controls the nucleus generation of the second transparent conductive film 122, and the second transparent conductive film 122 could be formed to have a large grain size.

As described above in detail, according to the present invention, a substrate 1 provided with a transparent conductive film for a photoelectric conversion device having large light confinement effects can be provided by effectively increasing the unevenness of the substrate provided with a transparent electrode layer using an inexpensive production method. Also, by applying this substrate 1 provided with a transparent conductive film for a photoelectric conversion device to a photoelectric conversion device, the performance of the photoelectric conversion device can be improved by increasing the electric current generation owing to the light confinement effects. Further, a substrate provided with a transparent conductive film for a photoelectric conversion device having a large unevenness can be fabricated with a thickness of about 1 μm, whereby the process damage to the transparent electrode layer at the time of fabricating an integrated structure can be restrained, making the light confinement effects and the low resistance be compatible with each other. This is effective in improving the performance and the reliability of the photoelectric conversion device.

INDUSTRIAL APPLICABILITY

As described above, the present invention can provide a photoelectric conversion device with improved performance.

The invention claimed is:

1. A method of manufacturing a photoelectric conversion device comprising:
   providing a substrate with a transparent electrode layer; and
   forming at least one photoelectric conversion unit and a back electrode layer on the transparent electrode layer, arranged in this order from a light incident side,
   wherein the substrate provided with the transparent electrode layer comprises a transparent insulating substrate and the transparent electrode layer directly deposited on a photoelectric conversion unit-side of the transparent insulating substrate, wherein the transparent electrode layer is composed of a double layer structure wherein first and second transparent conductive films, each consisting essentially of zinc oxide and containing a dopant, are deposited from a substrate side; the first transparent conductive film has an average film thickness of 10 to 500 nm, and the second transparent conductive film has an average film thickness of 300 to 1500 nm; the average film thickness of the second transparent conductive film is larger than the average film thickness of the first transparent conductive film; and an average height difference of an unevenness on a surface of the second transparent conductive film is 10 to 300 nm, and the average height difference of the unevenness on the surface thereof is larger than that of the first transparent conductive film, wherein forming the transparent electrode layer further comprises:

depositing the first transparent conductive film by a sputtering method; and depositing the second transparent conductive film by a low-pressure CVD method.

2. The method of manufacturing a photoelectric conversion device according to claim 1, wherein the substrate with the transparent electrode layer has a haze ratio of 20% or more, the haze ratio being a ratio of a diffusion light transmittance to a total light transmittance as measured by using a C light source or a D65 light source.

3. A method of manufacturing an integrated-type photoelectric conversion device comprising:

providing a substrate with a transparent electrode layer; and forming at least one crystalline photoelectric conversion unit and a back electrode layer on the transparent electrode layer, arranged in this order from a light incident side, wherein the photoelectric conversion unit and the back electrode layer are separated by a plurality of separation grooves so as to form a plurality of photoelectric conversion cells, and the plurality of these photoelectric conversion cells are electrically connected with each other in series via a plurality of connection grooves, wherein the substrate with the transparent electrode layer comprises a transparent insulating substrate and the transparent electrode layer directly deposited on a photoelectric conversion unit-side of the transparent insulating substrate, wherein the transparent electrode layer is composed of a double layer structure wherein first and second transparent conductive films, each consisting essentially of zinc oxide and containing a dopant, are deposited from a substrate side; the first transparent conductive film has an average film thickness of 10 to 500 nm, and the second transparent conductive film has an average film thickness of 300 nm to 1500 nm; the average film thickness of the second transparent conductive film is larger than the average film thickness of the first transparent conductive film; and an average height difference of an unevenness on a surface of the second transparent conductive film is 10 to 300 nm, and the average height difference of the unevenness on the surface of the second transparent conductive film is larger than that of the first transparent conductive film, wherein forming the transparent electrode layer further comprises:

depositing the first transparent conductive film by a sputtering method; and depositing the second transparent conductive film by a low-pressure CVD method.

4. The method of claim 1, wherein the dopant contained in the first transparent conductive film includes Aluminum.

5. The method of claim 1, wherein the dopant contained in the second transparent conductive film includes Boron.

6. The method of claim 1, wherein the first transparent conductive film is deposited to have an average film thickness of 30 nm or more.

* * * * *